United States Patent
Tsao et al.

(10) Patent No.: US 10,157,844 B2
(45) Date of Patent: Dec. 18, 2018

(54) FINFET DEVICE HAVING OXIDE LAYER AMONG INTERLAYER DIELECTRIC LAYER

(71) Applicant: TAIWAN SEMICONDUCTOR MANUFACTURING CO., LTD., Hsinchu (TW)

(72) Inventors: Chih-Pin Tsao, Hsinchu County (TW); Wei-Fang Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/730,803

(22) Filed: Oct. 12, 2017

(65) Prior Publication Data

US 2018/0151390 A1    May 31, 2018

Related U.S. Application Data

(60) Provisional application No. 62/426,652, filed on Nov. 28, 2016.

(51) Int. Cl.
*H01L 21/02* (2006.01)
*H01L 21/768* (2006.01)
(Continued)

(52) U.S. Cl.
CPC .. *H01L 23/53295* (2013.01); *H01L 21/76816* (2013.01); *H01L 21/76829* (2013.01);
(Continued)

(58) Field of Classification Search
CPC .. H01L 21/76829–21/76834; H01L 21/76877; H01L 21/823431; H01L 21/02126; H01L 21/02164; H01L 21/0217; H01L 21/823475; H01L 29/66795; H01L 29/7831; H01L 29/41791; H01L 29/785; H01L 27/1211; H01L 27/0886; H01L 23/53295; H01L 23/53233; H01L 23/5226; H01L 21/76832
See application file for complete search history.

(56) References Cited

U.S. PATENT DOCUMENTS 6,159,661 A * 12/2000 Huang ............... H01L 21/7681
257/E21.267
6,235,603 B1 * 5/2001 Melnick ........... H01L 21/31116
257/E21.018
(Continued)

*Primary Examiner* — Marvin Payen
*Assistant Examiner* — Jeremy Joy
(74) *Attorney, Agent, or Firm* — McClure, Qualey & Rodack, LLP

(57) ABSTRACT

A semiconductor device includes a semiconductor substrate having a fin structure. A gate structure is disposed over the fin structure. A first dielectric layer is disposed on the gate structure and the fin structure. A contact plug is disposed in the first dielectric layer and electrically connected to source/drain region in the fin structure. A second dielectric layer is disposed on the first dielectric layer. the second dielectric layer has a first nitride layer and a first etch stop layer, and the first nitride layer is disposed on the first etch stop layer. A via goes through the second dielectric layer and electrically connected to the contact plug. A metal layer is disposed on the second dielectric layer.

20 Claims, 10 Drawing Sheets

(51) Int. Cl.
*H01L 21/8234* (2006.01)
*H01L 23/532* (2006.01)
*H01L 27/088* (2006.01)
*H01L 27/12* (2006.01)
*H01L 29/165* (2006.01)
*H01L 29/417* (2006.01)
*H01L 29/66* (2006.01)
*H01L 29/78* (2006.01)

(52) U.S. Cl.
CPC .. *H01L 21/76832* (2013.01); *H01L 21/76834* (2013.01); *H01L 21/76877* (2013.01); *H01L 21/823431* (2013.01); *H01L 21/823475* (2013.01); *H01L 27/0886* (2013.01); *H01L 27/1211* (2013.01); *H01L 29/41791* (2013.01); *H01L 29/66795* (2013.01); *H01L 29/785* (2013.01); *H01L 29/7831* (2013.01); *H01L 21/0217* (2013.01); *H01L 21/02126* (2013.01); *H01L 21/02164* (2013.01); *H01L 21/76831* (2013.01); *H01L 23/53209* (2013.01); *H01L 23/53233* (2013.01); *H01L 23/53257* (2013.01); *H01L 29/165* (2013.01); *H01L 29/7848* (2013.01)

(56) References Cited

U.S. PATENT DOCUMENTS

| | | | | |
|---|---|---|---|---|
| 6,455,417 B1* | 9/2002 | Bao | ............... | H01L 21/02126 257/E21.277 |
| 6,509,267 B1* | 1/2003 | Woo | ............... | H01L 21/76801 257/E21.576 |
| 6,649,512 B1* | 11/2003 | Lee | ............... | H01L 21/76801 257/E21.576 |
| 7,030,041 B2* | 4/2006 | Li | ............... | C23C 16/02 257/E21.277 |
| 7,038,320 B1* | 5/2006 | You | ............... | H01L 21/76802 257/751 |
| 9,496,180 B2* | 11/2016 | Liou | ............... | H01L 21/823475 |
| 2002/0009873 A1* | 1/2002 | Usami | ............... | H01L 21/76811 438/620 |
| 2002/0081806 A1* | 6/2002 | Shin | ............... | H01L 27/115 438/257 |
| 2002/0110153 A1* | 8/2002 | Tomberlin | ............... | H04J 3/0632 370/503 |
| 2003/0001273 A1* | 1/2003 | Steiner | ............... | H01L 21/02126 257/760 |
| 2004/0067635 A1* | 4/2004 | Wu | ............... | H01L 21/31105 438/624 |
| 2005/0110153 A1* | 5/2005 | Wu | ............... | H01L 21/76832 257/762 |
| 2005/0169096 A1* | 8/2005 | Lee | ............... | C09K 13/08 365/232 |
| 2006/0197193 A1* | 9/2006 | Gu | ............... | H01L 21/76834 257/661 |
| 2008/0283975 A1* | 11/2008 | Matz | ............... | H01L 21/02126 257/642 |
| 2011/0021035 A1* | 1/2011 | Kwon | ............... | C23C 16/30 438/761 |
| 2015/0155234 A1* | 6/2015 | Shih | ............... | H01L 23/53295 257/774 |
| 2015/0171206 A1* | 6/2015 | van Dal | ............... | H01L 29/66522 257/192 |
| 2015/0311158 A1* | 10/2015 | Liou | ............... | H01L 21/76829 257/760 |
| 2015/0371899 A1* | 12/2015 | Zhang | ............... | H01L 21/288 438/666 |
| 2016/0104645 A1* | 4/2016 | Hung | ............... | H01L 21/823437 257/401 |
| 2016/0190002 A1* | 6/2016 | Lin | ............... | H01L 21/76837 438/666 |
| 2016/0190287 A1* | 6/2016 | Hsu | ............... | H01L 21/31144 438/299 |
| 2016/0358908 A1* | 12/2016 | Xie | ............... | H01L 27/088 |

\* cited by examiner

FINFET DEVICE HAVING OXIDE LAYER AMONG INTERLAYER DIELECTRIC LAYER

CROSS-REFERENCE TO RELATED APPLICATION

This application claims priority to U.S. Provisional Application Ser. No. 62/426,652, filed Nov. 28, 2016, which is herein incorporated by reference.

BACKGROUND

When forming a via coupling between the metal contact and the upper metal layer, the via usually goes through a dielectric layer containing two nitride layers and an oxide layer. When patterning the dielectric layer to form vias of a broad variety of dimensions, the nitride layers can be easily over consumed during the etching process. Another thin native oxide layer, which is formed along with the formation of the nitride layers, can be found between the nitride layers, but this native oxide layer cannot arrest the etching process between the nitride layers. As a result, the depth of the vias may vary even if they are formed within the same dielectric layer.

Shortening the etching time during via formation may ease the over etching issue. However, reducing etching time results in smaller contact interface between the metal contact and the via, and consequently an increased contact resistance. Also, in places where an etching speed is slower than in other places, via may not be formed at all.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
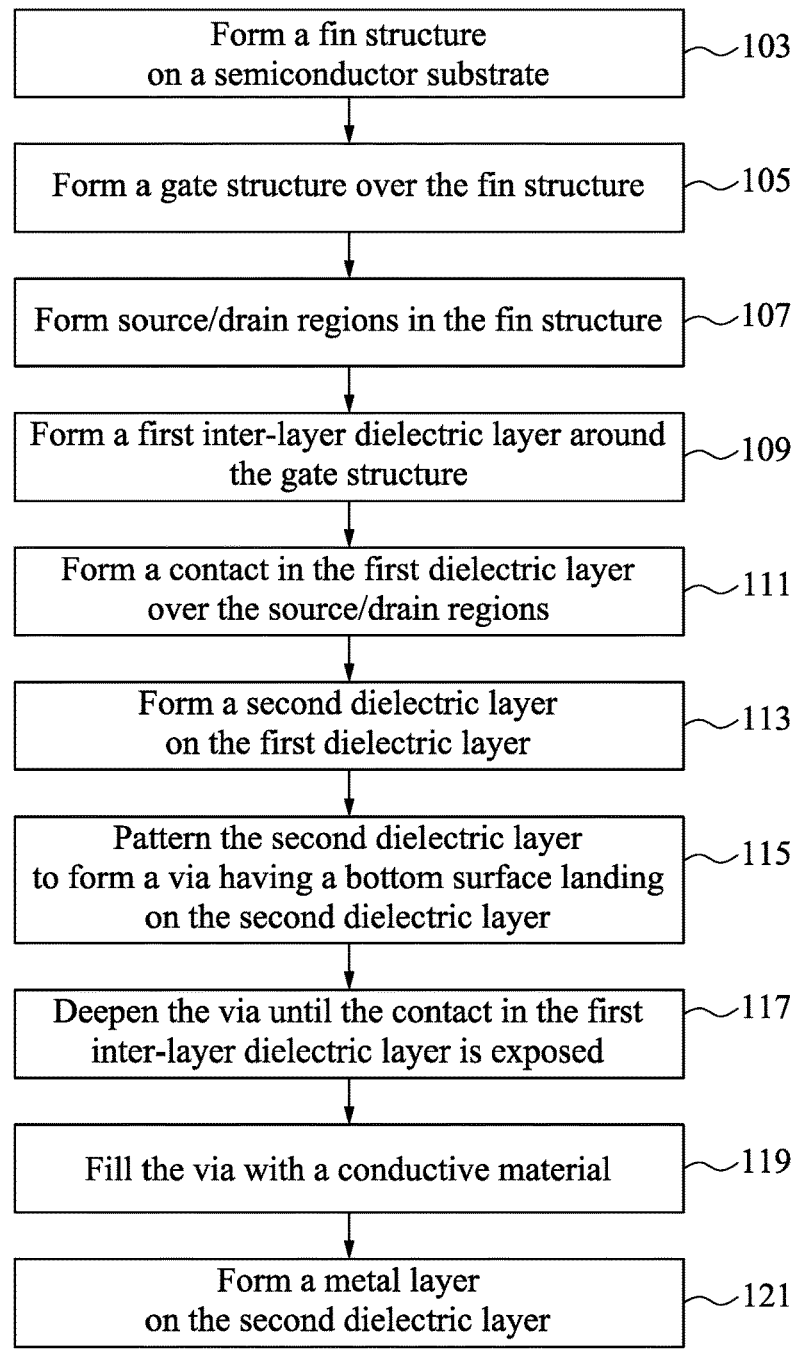
FIG. 1 is a flow chart illustrating a method of fabricating a FinFET device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method 100 of fabricating an integrated circuit in accordance with some embodiments of the instant disclosure. The method 100 begins with operation 103 in which a fin is formed on a semiconductor substrate. The method continues with operation 105 in which a gate structure is formed over the fin structure. The method continues with operation 107 in which source/drain regions are formed in the fin structure. The method continues with operation 109 in which a first inter-layer dielectric layer is formed around the gate structure. The method continues with operation 111 in which a contact is formed in the first dielectric layer over the source/drain regions. The method continues with operation 113 in which a second dielectric layer is formed on the first dielectric layer. The method continues with operation 115 in which the second dielectric layer is patterned to form a via having a bottom surface landing on the second dielectric layer. The method continues with operation 117 in which the via is deepen until the contact in the first inter-layer dielectric layer is exposed. The method continues with operation 119 in which the via is filled with a conductive material. The method continues with operation 121 in which a metal layer is formed on the second inter-layer dielectric layer.

Figure 2:
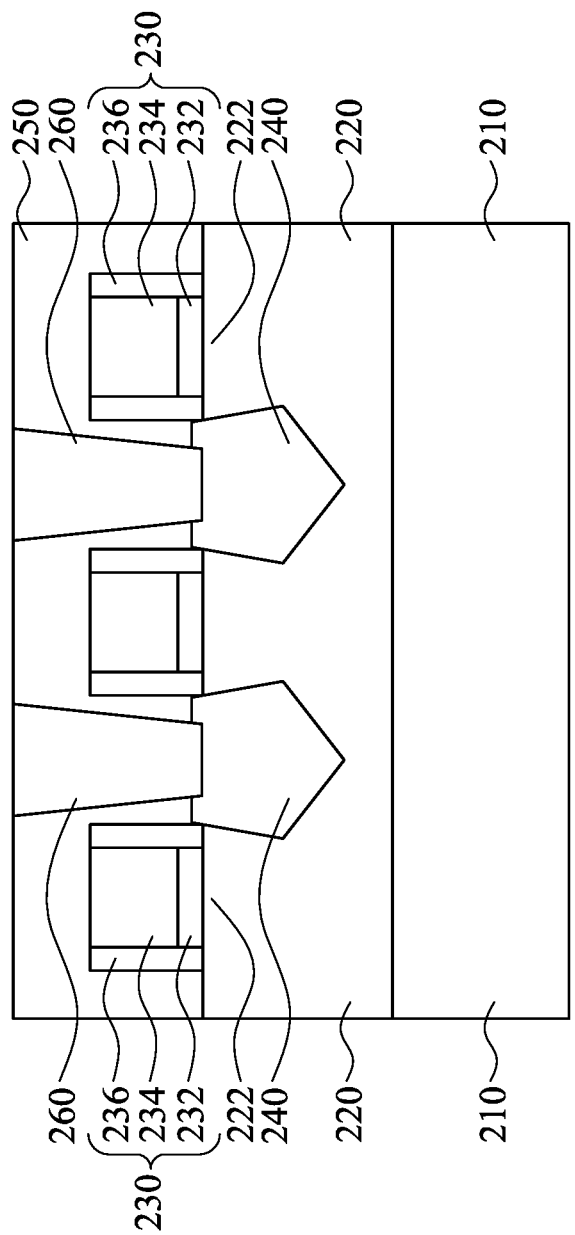
FIGS. 2-7 are schematic fragmentary cross-sectional level views of a FinFET device at different stages of fabrication in accordance with some embodiments of the instant disclosure.

Referring to FIG. 2, a cross-sectional view of a semiconductor device along a fin is illustrated. A semiconductor substrate 210 is provided. The semiconductor substrate 210 may include silicon, germanium, silicon germanium, gallium arsenide or other suitable semiconductor materials. At least one semiconductor fin 220 is formed on the semiconductor substrate 210. Isolation structure (not shown) is formed in the gaps between the fins 220 on the semiconductor substrate 210. The isolation structure may be shallow trench isolations (STI), formed by, for example, chemical vapor deposition (CVD) using tetra-ethyl-ortho-silicate (TEOS) and oxygen as a precursor. In some other embodiments, the isolation structure may be formed by implanting ions, such as oxygen, nitrogen, carbon, or the like, into the semiconductor substrate 210. In yet some other embodiments, the isolation structure is insulator layer of a SOI wafer.

Gate structures 230 are formed on the fins 220. Each of the gate structures 230 includes a gate dielectric layer 232, a gate electrode layer 234 and spacers 236. The gate dielectric layer 232 may be formed by a material, for example, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), and a combination thereof. The gate dielectric layer 232 may be constituted of more than one layer. In some embodiments, the gate dielectric layer 232 may be composed of a silicon oxide layer (e.g., interfacial layer) and a high-k dielectric layer.

The gate electrode layer 234 is formed on the gate dielectric layer 232 and includes a conductive material, for example, tungsten (W). In some embodiments, work function metal layer(s) (not shown) is formed wrapping around the gate electrode layer 234. When a gate last process is employed, a dummy gate layer (not shown) is firstly formed on the gate dielectric layer 232. At a later stage, for example, after the fin 220 is patterned to form the source/drain regions, the dummy gate layer is then removed, and the gate electrode layer 234 fills in the recess left by the dummy gate layer. The spacers 236 are formed on sidewalls of the gate dielectric layer 232 and the gate electrode layer 234. The spacers 236 may include a material of SiN, oxynitride, SiC, SiON, oxide, and the like.

Still referring to FIG. 2, the gate structures 230 span across the ridges of the fins 220 and define channel regions 222 at the intersections where the gate dielectric layer 232 and the fins 220 meet. The gate structures 230 are used as a mask layer to form the source/drain regions 224. The exposed fins 220 are removed to form recesses between the isolation structures. Source/drain regions 240 are epitaxially grown by, for example, low pressure CVD (LPCVD) process in the recesses. The source/drain regions 240 may include a material of silicon carbon (SiC) for an n-type FinFET or silicon germanium (SiGe) for a p-type FinFET. Since the lattice constant of the source/drain regions 240 is different from the semiconductor substrate 210, the channel regions 222 of the fins 220 are strained or stressed to enable carrier mobility of the device and enhance the device performance.

Still referring to FIG. 2, a first inter-level dielectric (ILD) layer 250 is formed on the fin 220 and the gate structures 230. The first ILD layer 250 adheres to the gate structures 230 and over the top of the gate electrode layer 234. At least a contact plug 260 is formed in the first ILD layer 250. A photoresist layer (not shown) is formed on the first ILD layer 250 and patterned to define the position of the contact plug 260. The contact plug 260 is positioned above the source/drain regions 240 and allows electrical connection between the source/drain regions 240 in the fin 220 to an upper metal layer. Once the photoresist layer is patterned, an etching is performed to remove a portion of the first ILD layer 250, and a contact plug hole is formed. The contact plug hole is filled with conductive metal material including, for example, cobalt (Co) and tungsten (W). A planarization process, for example, chemical mechanical planarization, may be perform to bring the first ILD layer 250 and the contact plug 260 to a planar surface. The contact plug 260 has a top surface 262 exposes from the first ILD layer 250. The contact plug 260 serves as a bridge electrically connecting the source/drain regions 240 to the upper metal layer, and the gate structures 230 remain the same during contact plug 260 formation.

Figure 3:
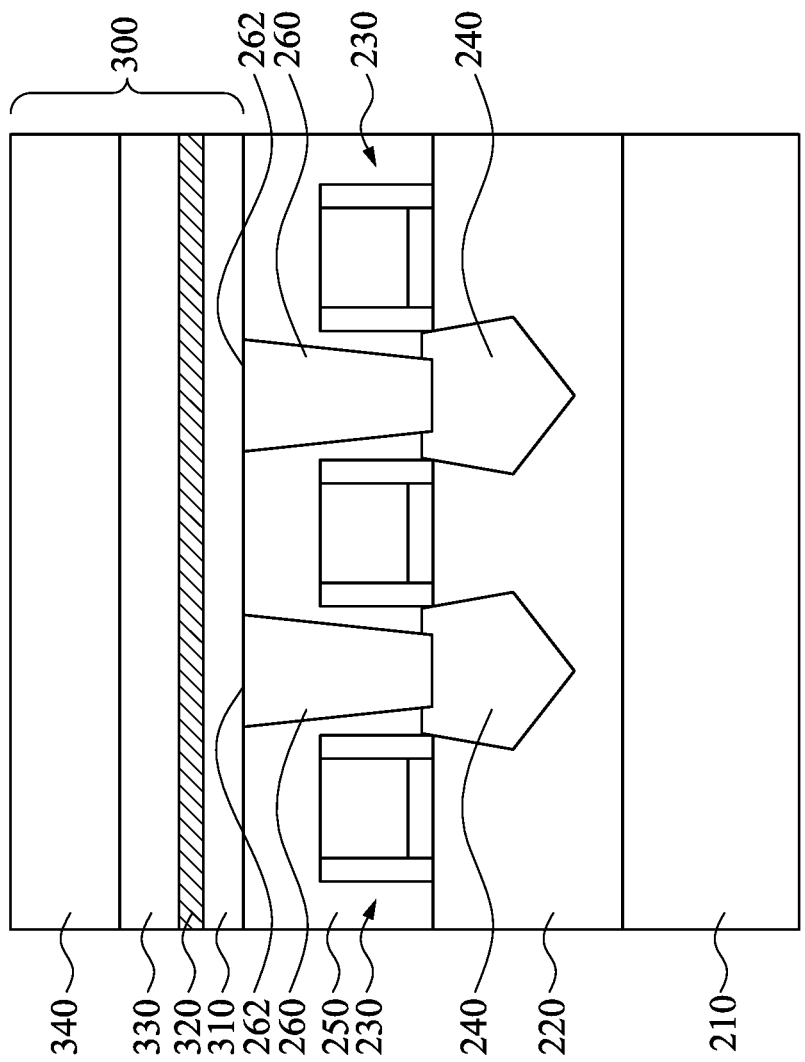

Referring to FIG. 3, a cross-sectional view of a finFET device at a stage of manufacturing process. A second interlayer dielectric layer 300 is formed on the first ILD layer 250 and the contact plug 260. The second ILD layer 300 includes more than one layer. In some embodiments, the second ILD layer 300 includes a first nitride layer 310, a first etch stop layer 320, a second nitride layer 330, and an oxide layer 340. The second ILD layer 300 may be deposited by, for example, CVD, atomic layer deposition (ALD), diffusion, and any other suitable process. The first nitride layer 310 is disposed on the surface of the first ILD layer 250 and the top surface 262 of the contact plug 260. Following the first nitride layer 310, a first etch stop layer 320 is disposed on the first nitride layer 310. The second nitride layer 330 is disposed on the first etch stop layer 320.

The first nitride layer 310 and second nitride layer 330 are made of similar material containing nitrogen. Examples of nitride composition include $Si_xN_y$, $Si_wC_xO_yN_z$, and w, x, y, and z are numbers larger than 0. In some embodiments, the first nitride layer 310 may be $Si_xC_y$, and x and y are numbers larger than 0. The first nitride layer 310 and the second nitride layer 330 may include the same composition. Alternatively, the first nitride layer 310 and the second nitride layer 330 may include different nitride materials. The first etch stop layer 320 is made of a material that exhibits high etching selectivity in comparison with the first nitride layer 310 and the second nitride layer 330. The first etch stop layer 320 has a lower etching rate than the first nitride layer 310 and the second nitride layer 330 for arresting an etching process. Examples of the material of the first etch stop layer 320 include $Si_xO_y$, $Si_xO_yC_z$, and $Si_wC_xO_yN_z$, and w, x, y, and z are numbers larger than 0. For example, when the first nitride layer 310 and the second nitride layer 330 are made of SiN, the material of the first etch stop layer 320 may be $SiO_2$. The material of the first etch stop layer 320 depends on the material used for the first nitride layer 310 and the second nitride layer 330. In order to achieve a lower etching rate at the first etch stop layer 320, the material of the first nitride layer 310 and the second nitride layer 330 cannot be the same as the first etch stop layer 320. The oxide layer 340 is disposed on the second nitride layer 330. The material of the oxide layer 340 may be the same as the first etch stop layer 320 or any other oxide material.

In some embodiments, a thickness of the first nitride layer 310 ranges between 10 and 50 angstroms (Å). The first etch stop layer 320 has a thickness equal to or larger than 20 angstroms. In some embodiments, the first etch stop layer 320 has a thickness of 50 Å. A thickness of the second nitride layer 330 ranges between 100 and 120 Å. A thickness of the oxide layer 340 ranges between 80 and 150 Å.

Figure 4:
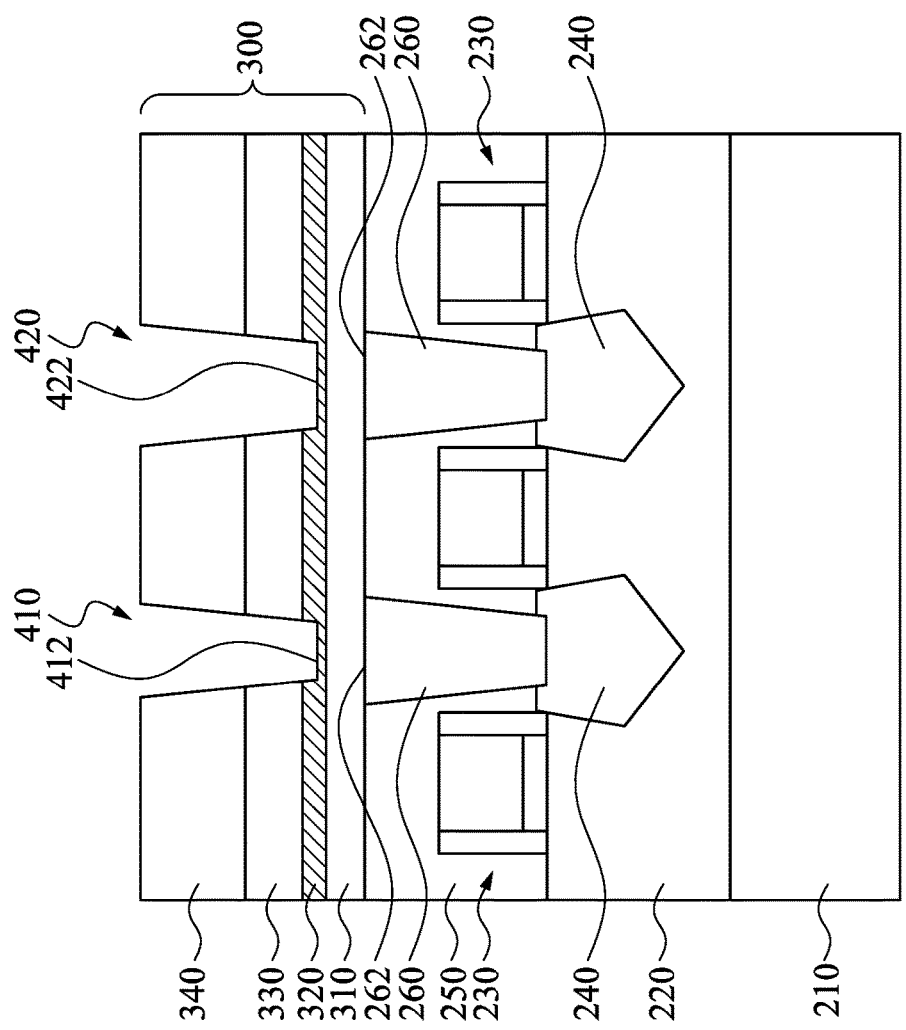

Referring to FIG. 4, a cross-sectional view of a finFET device at a stage of manufacturing process is illustrated. The second ILD layer 300 is stacked on the first ILD layer 250, and via holes 410, 420 are formed in the second ILD layer 300. Via holes 410, 420 are positioned above the contact plugs 260 that is electrically linked to the source/drain regions 240 in the fin 220. The via holes 410, 420 have a height (thickness) spanning across the entire second ILD layer 300. During via hole formation, the etching process is arrested at the first etch stop layer 320, and then the etching process is resumed to reach its intended height.

Still referring to FIG. 4, a first photoresist layer (not shown) is disposed on the second ILD layer 300 and patterned to mark the positions of via holes 410, 420. Etching process, for example, dry etching, is performed to remove portions of the oxide layer 340 according to the patterned photoresist layer. A second photoresist layer (not shown) is used for etching the underlying second nitride layer 330, and the etching rate speeds up because of the nitride composition. A third photoresist layer (not shown) is used and the via holes 410, 420 come to an arrest at the first etch stop layer 320. The etching rate reduces to a halt because of the etching selectivity between the second nitride layer 330 and the first etch stop layer 320. The arrest of the etching process shows advantages in via uniformity.

On a finFET device, the via height is similar, but the via dimension and distribution density may vary according to device design. In some embodiments, the via holes 410, 420 have different diameters. In some embodiments, the via holes may have similar dimension. Because the dimension and distribution density of the vias are slightly different across the finFET device, at some regions the etching process may proceed with a faster rate while slower at the other regions. In the absence of the first etch stop layer 320, one via hole may progress into the first nitride layer 310, while another via hole is still negotiating at the second nitride layer 330. Via uniformity may be compromised in this situation. An uneven via height is likely to occur. The first etch stop layer 320 allows a buffer region during via hole formation. Due to the etching selectivity between the first etch stop layer 320 and the second nitride layer 330, the etching process comes to an arrest at the first etch stop layer 320 even if via holes have different diameters. The etching rate decrease when encountering the first etch stop layer 320. The insertion of the first etch stop layer 320 ensures that when the third photoresist layer is used and a third run of etching is conducted, the via holes all arrives at the same level (depth) regardless the dimension and distribution density.

It should be understood that a thin, native oxide layer may be formed on the first nitride layer 310 during the second ILD layer 300 deposition. The first etch stop layer 320 is another layer formed on the native oxide layer of the first nitride layer 310. The thickness of the first etch stop layer 320 is equal to or larger than 20 Å so as to arrest the etching process.

Still referring to FIG. 4, when dry etching is performed, the via holes 410, 420 are deepened gradually. When the etching process meets the first etch stop layer 320, the etching rate comes to a halt. This pause allows via holes 410, 420 arrive at the same level even if they have different diameters. More specifically, in some embodiments, via hole 410 has a narrower diameter, while via hole 420 has a broader diameter. Via hole 420 formation may take up longer time because of its dimension. Via hole 410 may progress faster than the via hole 420 during etching, and the first etch stop layer 320 prevents the via hole 410 from overtaking the via hole 420 to a deeper extent. The narrower via hole 410 and broader via hole 420 rest at the first etch stop layer 320 at this stage. The via holes 410, 420 land on the first etch stop layer 320, and the bottom surfaces 412, 422 of the via holes 410, 420 are defined by the first etch stop layer 320. The via holes 410, 420 do not reach their final destination yet because the top surfaces 262 of the contact plugs 260 are not exposed. At this stage, the top surfaces 262 of the contact plugs 260 are covered by the first nitride layer 310.

Figure 5:
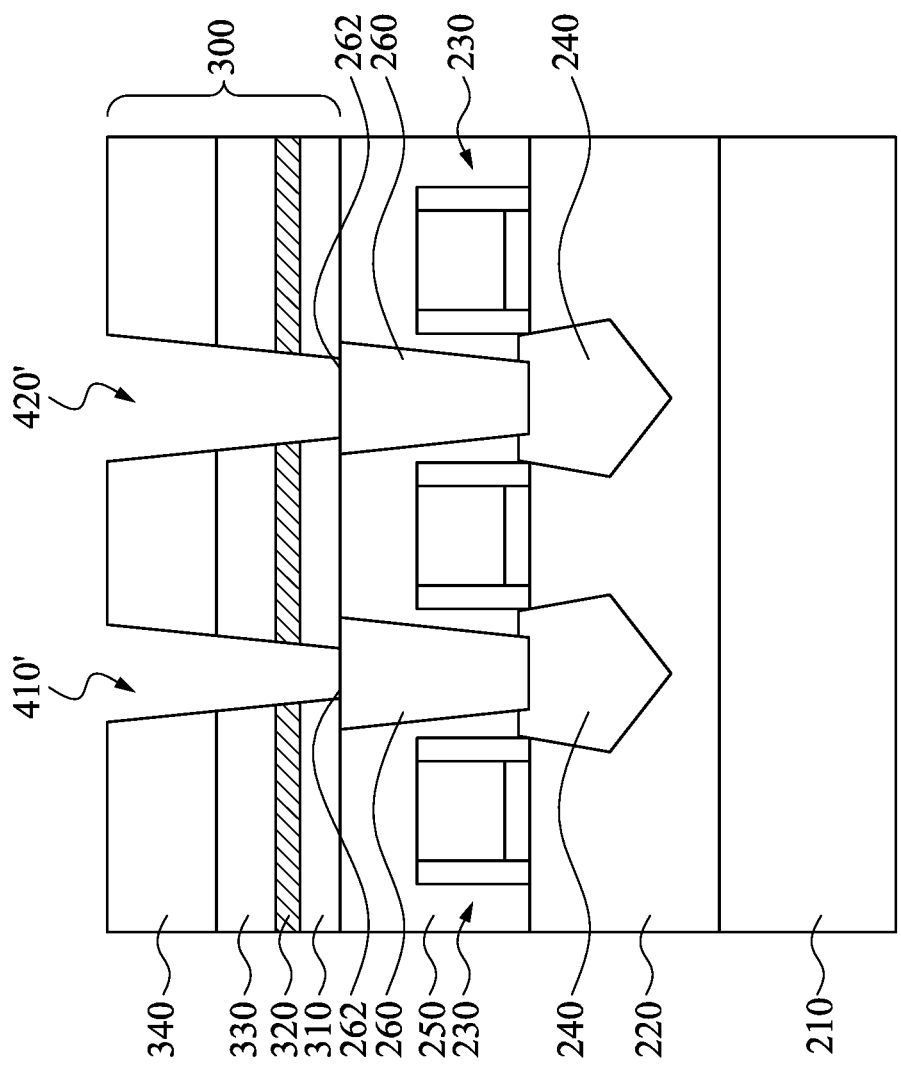

Referring to FIG. 5, a cross-sectional view of a finFET device in the manufacturing process is illustrated. The via holes 410', 420' are deepened to expose the top surfaces 262 of the contact plugs 260. The height of the via holes 410', 420' measured from the surface of the first ILD layer 250 to the surface of the second ILD layer 300 is uniform even though they have different diameters. In the previous stage, the via holes 410, 420 are arrested at the first etch stop layer 320. The via holes 410, 420 may have slightly different diameters but the depth (height) is the same, and the bottom surfaces 412, 422 are at the same level (first etch stop layer 320). A forth photoresist layer (not shown) is used, and via holes 410, 420 are etched further down the second ILD layer 300. The via holes 410', 420' are deepened until the top surfaces 262 of the contact plug 260 are exposed through the via holes 410', 420' respectively. In the last lag of via hole formation, the etching process is relatively simplified because the first etch stop layer 320 and the first nitride layer 310 remain as the targets. Once the via holes 410, 420 passes through the first etch stop layer 320, the remaining second ILD layer 300 is the first nitride layer 310. The first nitride layer 310 is thinner and closer to the top surfaces 262 of the contact plugs 260, and therefore the etching variation can be limited.

When etching the second ILD layer 300 to form the via holes 410', 420', height variation might occur because of via dimension and distribution density. The insertion of the first etch stop layer 320 allows a rest during the via hole etching process. The via holes 410, 420 arrive at the same level, and the height of the via holes 410, 420 are ensured to be at the first etch stop layer 320. The via holes 410, 420 are then deepened until they touch down the top surfaces 262 of the contact plugs 260. The first etch stop layer 320 enlarges via etching punch window, and when the next lag takes place, the via holes 410, 420 progress from the same level and further down the second ILD layer 300. In this way, a uniform via height can be easily achieved.

Figure 6:
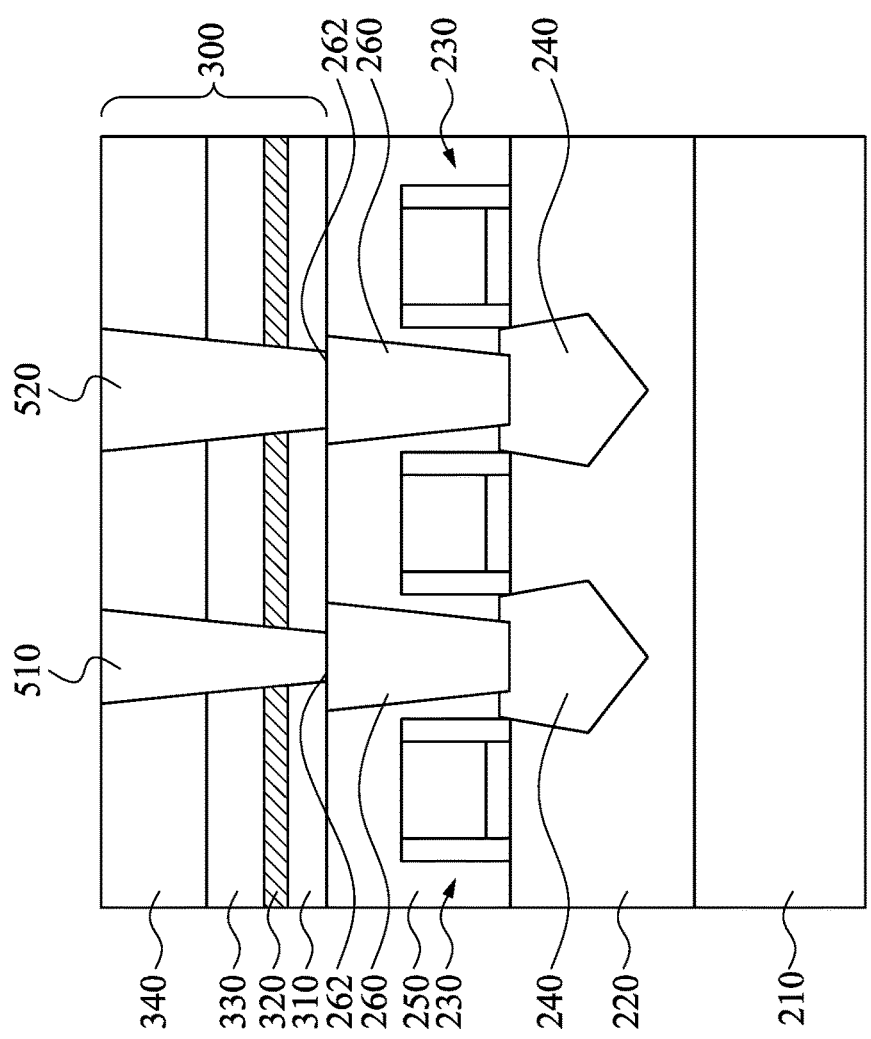

Referring to FIG. 6, a cross-sectional view of a finFET device in a manufacturing process is illustrated. The via holes 410', 420' are filled with conductive material to form the vias 510, 520. After the via holes 410', 420' are formed, an electrically conductive material, for example, cobalt (Co) or tungsten (W), fills in the via holes 410', 420'. The conductive material over fills the via holes 410', 420', and then a planarization process is performed to remove the excess conductive material on the surface of the second ILD layer 300. The vias 510, 520 have different diameters while the height remains substantially the same measured from the top surfaces 262 of the contact plugs 260 to the surface of the second ILD layer 300. The vias 510, 520 span across the second ILD layer 300 and have similar height as the thickness of the second ILD layer 300.

Figure 7:
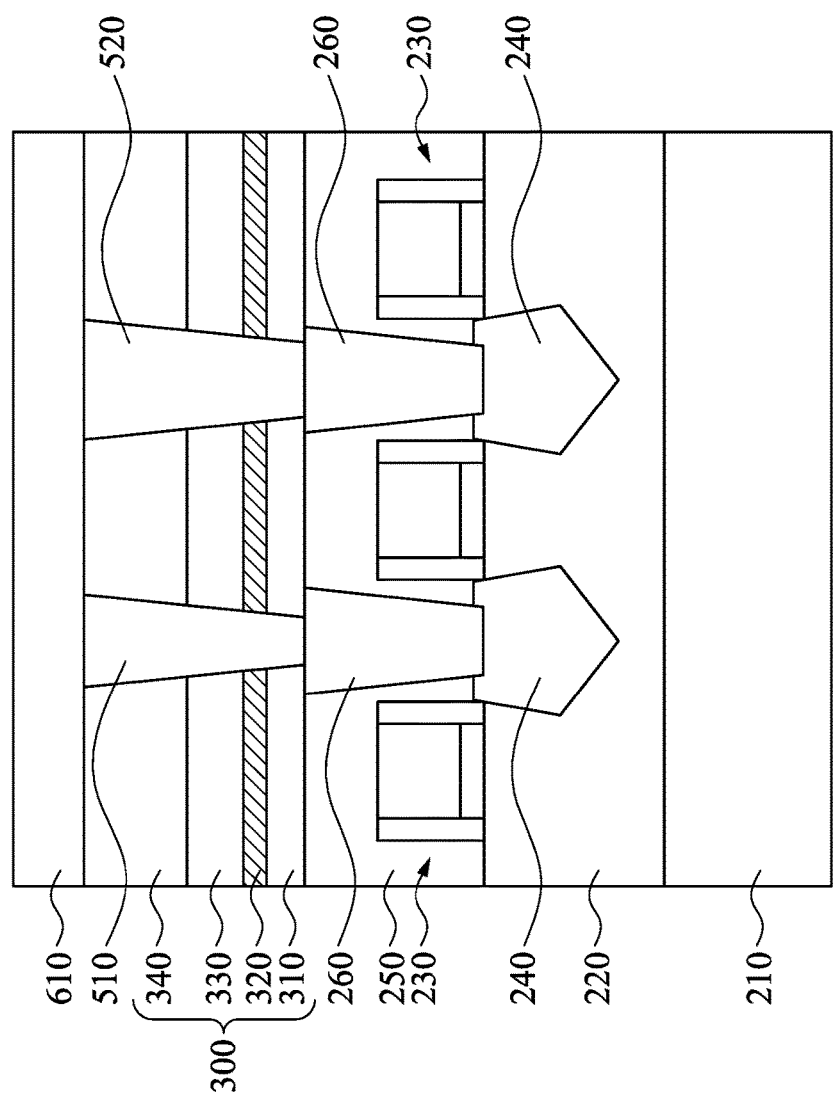

Referring to FIG. 7, a cross-sectional view of a finFET device in a manufacturing process is illustrated. A metal layer 610 is formed on the second ILD layer 300. The metal layer 610 includes metal routing for connecting among different components at another level different from the source/drain regions 240 in the finFET device. The source/drain regions 240 in the fin 220 are electrically connected to the metal layer 610 through the contact plugs 260 and the vias 510, 520.

Figure 8:
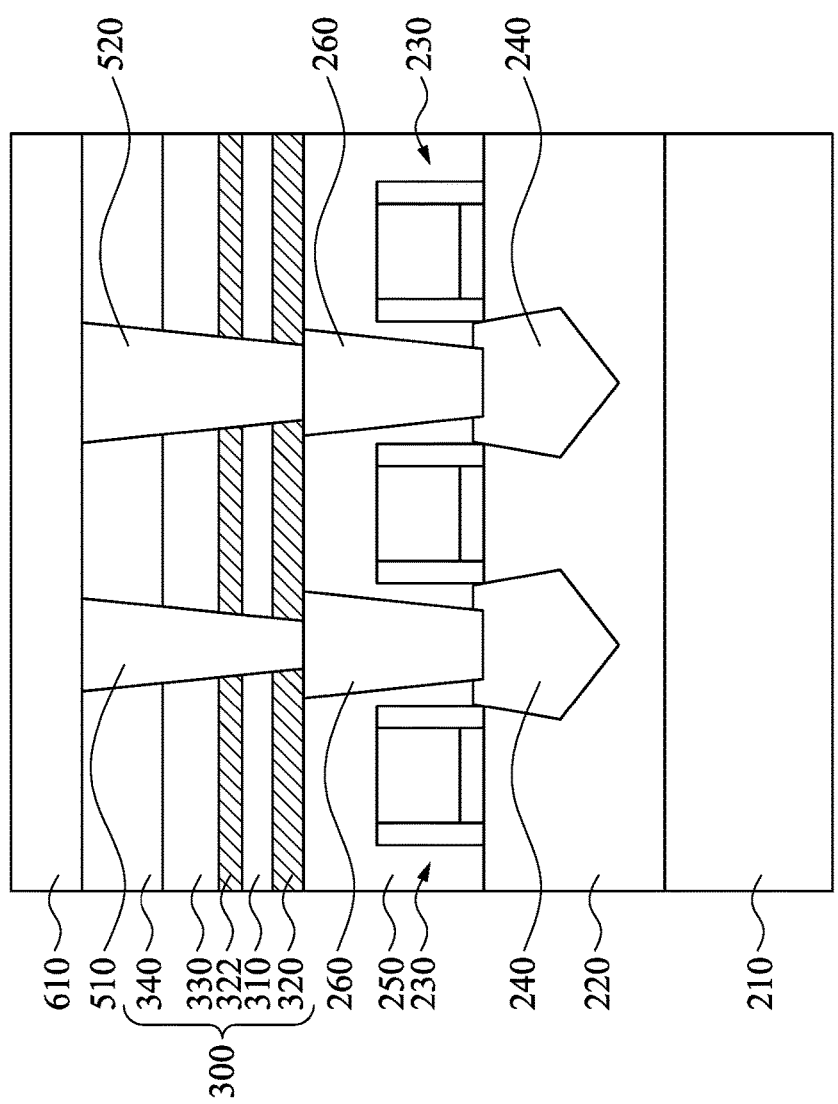
FIG. 8 is a schematic fragmentary cross-sectional level view of a FinFET device in accordance with some embodiments of the instant disclosure.

Attention is now invited to FIG. 8. In some embodiments, the second ILD layer 300 includes different layers, or the layers are arranged in different orders. As shown in FIG. 8, the second ILD layer 300 includes the first nitride layer 310, the first etch stop layer 320, a second etch stop layer 322, the second nitride layer 330, and the oxide layer 340. The second etch stop layer 322 is made of similar material as the first etch stop layer 320. The second etch stop layer 322 may be the same material as the first etch stop layer 320 or different. The second etch stop layer 322 also exhibits etching selectivity in comparison with the first nitride layer 310 and the second nitride layer 330. A thickness of the second etch stop layer 322 is equal to or larger than 20 Å. The first and second etch stop layer 320, 322 may have different thickness or the same. The first etch stop layer 320 is disposed on the first ILD layer 250 and in contact with the top surfaces 262 of the contact plugs 260. The first nitride layer 310 is disposed on the first etch stop layer 320. The second etch stop layer 322 is disposed on the first nitride layer 310. The first nitride layer 310 is interposed in between the first etch stop layer 320 and the second etch stop layer 322. The second nitride layer 330 is disposed on the second etch stop layer 322, followed by the oxide layer 340 on the second nitride layer 330.

Still referring to FIG. 8, when the via holes are to be formed, the via holes go down from the oxide layer 340 to the second nitride layer 330 and then meet the second etch stop layer 322. The etching rate is therefore held up at the second etch stop layer 322 because the material used for the second nitride layer 330 has a higher etching rate than the second etch stop layer 322. After the first arrest, the via hole formation comes to the first nitride layer 310. The etching rate picks up, but the first etch stop layer 320 is waiting at the bottom. In this dual etch stop layer arrangement, the via hole formation process is held back twice at the second etch stop layer 322 and the first etch stop layer 320. When the etching process comes to the first etch stop layer 320, the etching rate reduces again and ensures a uniform via height at this level by slower, gradual etching rate. When the conductive material fills in the via holes, vias 510, 520 with substantially the same height are complete. The metal layer 610 is disposed on the second ILD layer 300.

Figure 9:
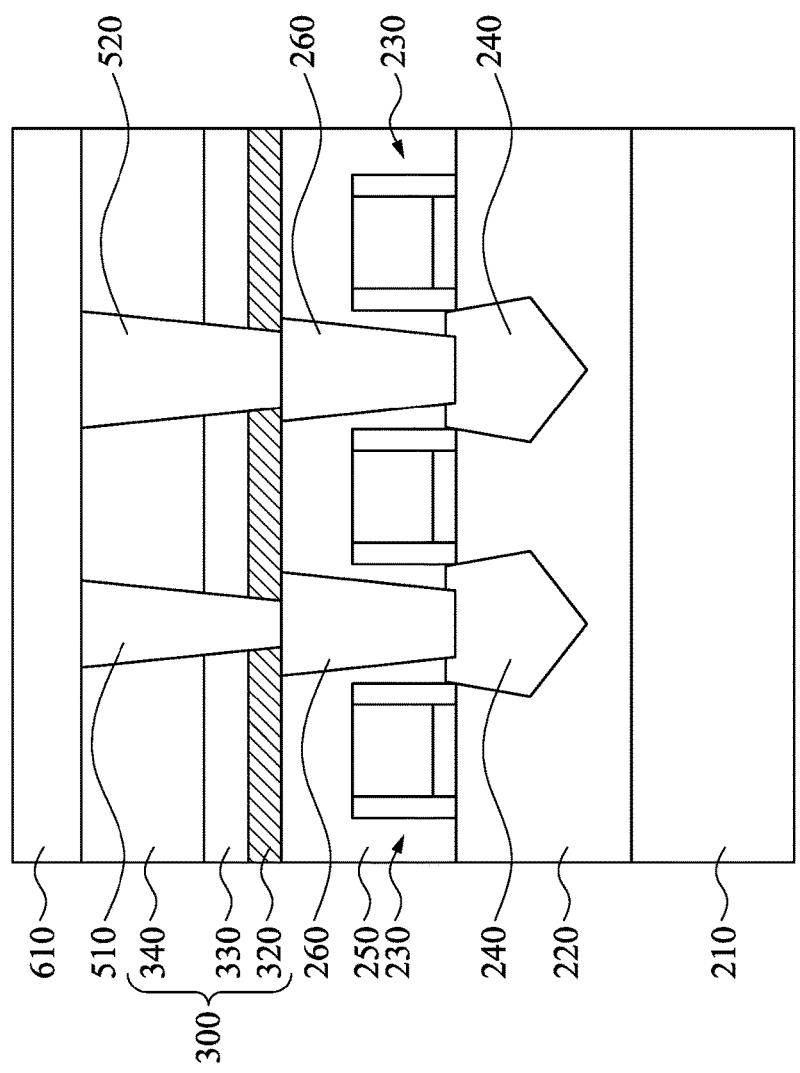
FIG. 9 is a schematic fragmentary cross-sectional level view of a FinFET device in accordance with some embodiments of the instant disclosure.

Attention is now invited to FIG. 9. In some embodiments, the second ILD layer 300 includes three layers. The three layers from the first ILD layer 250 to the metal layer 610 are the first etch stop layer 320, the second nitride layer 330, and the oxide layer 340. The via hole formation meets the first etch stop layer 320 right before the via holes touch down the first ILD layer 250. This arrangement of the first etch stop layer 320 and the second nitride layer 330 also allows etching selectivity, and the etching rate slows down to ensure the via holes arrive at the same level (first etch stop layer 320) before their completion.

Figure 10:
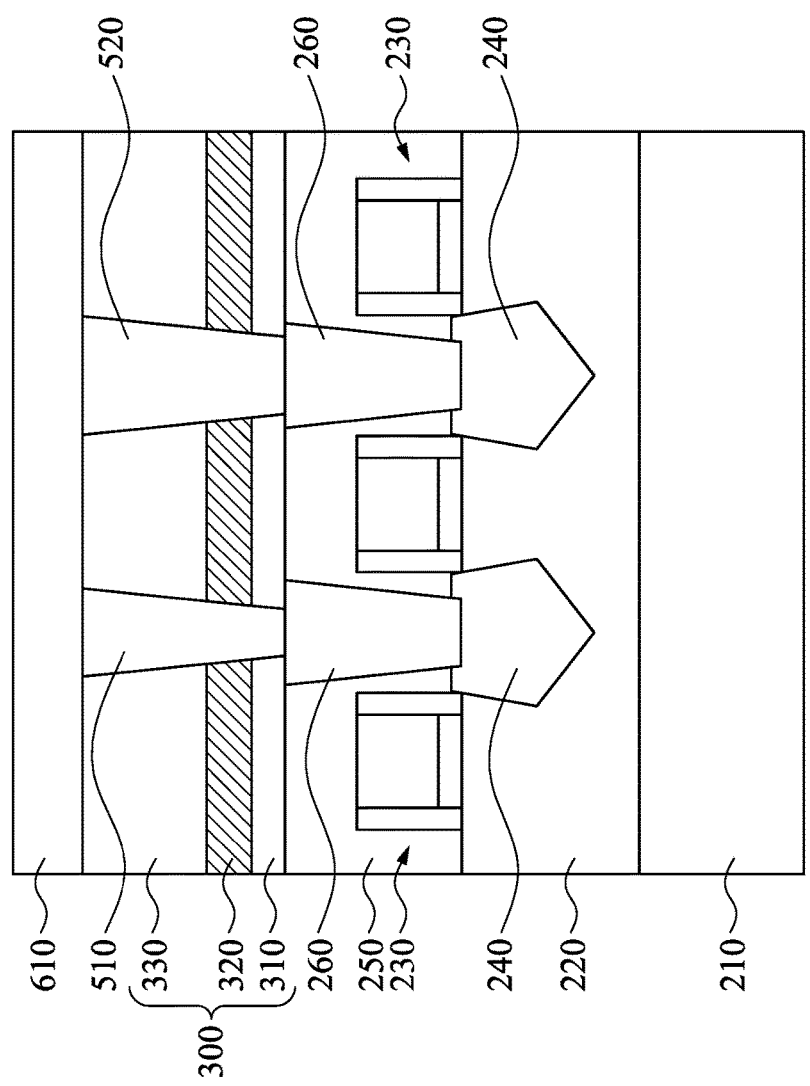
FIG. 10 is a schematic fragmentary cross-sectional level view of a FinFET device in accordance with some embodiments of the instant disclosure.

Attention is now invited to FIG. 10. In some embodiments, the second ILD layer 300 includes the first nitride layer 310, the first etch stop layer 320, and the second nitride layer 330. In this embodiment, the second nitride layer 330 is much thicker than the first etch stop layer 320 and the first nitride layer 310. During via formation, the etching process continues in the second nitride layer 330 for at least two thirds of the entire thickness of the second ILD layer 300 until the first etch stop layer 320 is met at the bottom portion. The bottom surfaces of the via holes land on the first etch stop layer 320, and then in the next leg of etching process the via holes are deepened from the first etch stop layer 320 until the top surfaces of the contact plugs 260 are exposed.

The insertion of the etch stop layer in the second ILD layer allows via etching arrest. The different etching rates between the etch stop layer and its upper and bottom layers slow down the etching process and ensure via hole landing at the same level before it reaches the contact plug.

In some embodiments, a semiconductor device includes a semiconductor substrate having a fin structure. A gate structure is disposed over the fin structure. A first dielectric layer is disposed on the gate structure and the fin structure. A contact plug is disposed in the first dielectric layer and electrically connected to source/drain region in the fin structure. A second dielectric layer is disposed on the first dielectric layer. the second dielectric layer has a first nitride layer and a first etch stop layer, and the first nitride layer is disposed on the first etch stop layer. A via goes through the second dielectric layer and electrically connected to the contact plug. A metal layer is disposed on the second dielectric layer.

In some embodiments, a semiconductor device includes a semiconductor substrate having a fin structure. A gate structure is disposed over the fin structure. A first dielectric layer is disposed on the gate structure and the fin structure. A contact plug is disposed in the first dielectric layer and electrically connected to source/drain region in the fin structure. A second dielectric layer is disposed on the first dielectric layer. the second dielectric layer has a first nitride layer and an etch stop layer, and the etch stop layer has a thickness larger than 20 Å. A via goes through the second dielectric layer and electrically connected to the contact plug. A metal layer is disposed on the second dielectric layer.

A method of fabricating a semiconductor device includes forming a fin structure on a semiconductor substrate. A gate structure is formed on the fin structure. A first dielectric layer is formed around the gate structure. A contact plug is formed in the first dielectric layer. The contact plug is electrically connected to the source/drain regions. A second dielectric layer is formed on the first dielectric layer. The second dielectric layer is patterned to form a via hole having a bottom surface landing on the second dielectric layer. The via hole is deepened until the underlying contact plug is exposed. The via hole is filled with a conductive material. A metal layer is formed on the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate having a fin structure;
   a gate structure over the fin structure;
   a first dielectric layer on the gate structure and the fin structure;
   a contact plug disposed in the first dielectric layer and electrically connected to source/drain regions in the fin structure;
   a second dielectric layer disposed on the first dielectric layer, wherein the second dielectric layer has a first nitride layer, a first etch stop layer in contact with the first dielectric layer, a second nitride layer, and a second etch stop layer interposed in between the first and second nitride layers and the first nitride layer is disposed on the first etch stop layer;
   a via going through the second dielectric layer and electrically connected to the contact plug; and
   a metal layer disposed on the second dielectric layer.

2. The semiconductor device of claim 1, wherein the first etch stop layer has a thickness larger than 20 Å.

3. The semiconductor device of claim 1, wherein the first etch stop layer has a lower etching rate than the first nitride layer.

4. The semiconductor device of claim 1, wherein the first etch stop layer is an oxide layer.

5. The semiconductor device of claim 1, wherein the first etch stop layer is interposed in between the first dielectric layer and the first nitride layer.

6. The semiconductor device of claim 1, further comprising an oxide layer on the second nitride layer.

7. The semiconductor device of claim 1, wherein the first etch stop layer is in contact with a top surface of the contact plug.

8. A semiconductor device comprising:
a semiconductor substrate having a fin structure;
a gate structure over the fin structure;
a first dielectric layer on the gate structure and the fin structure; and
a contact plug disposed in the first dielectric layer and electrically connected to source/drain regions in the fin structure;
a second dielectric layer disposed on the first dielectric layer, wherein the second dielectric layer has a first nitride layer, a first etch stop layer interposed in between the first nitride layer and the first dielectric layer, a second nitride layer, and a second etch stop layer interposed in between the first and second nitride layers, and the first etch stop layer has a thickness larger than 20 Å;
a via going through the second dielectric layer and electrically connected to the contact plug; and
a metal layer disposed on the second dielectric layer.

9. The semiconductor device of claim 8, wherein the first etch stop layer has a lower etching rate than the first nitride layer.

10. The semiconductor device of claim 8, wherein the first etch stop layer includes a material selected from $Si_xO_y$, $Si_xO_yC_z$, $Si_wC_xO_yN_z$, and w, x, y, and z are larger than 0.

11. The semiconductor device of claim 8, wherein the first etch stop layer is in contact with the first dielectric layer.

12. The semiconductor device of claim 8, wherein the first etch stop layer is in contact with a top surface of the contact plug.

13. The semiconductor device of claim 8, further comprising an oxide layer on the second nitride layer.

14. The method of claim 13, wherein the bottom surface of the via hole lands on the etch stop layer.

15. The semiconductor device of claim 8, wherein the first etch stop layer is an oxide layer.

16. A method of fabricating a semiconductor device comprising:
forming a fin structure on a semiconductor substrate;
forming a gate structure over the fin structure;
forming source/drain regions in the fin structure;
forming a first dielectric layer around the gate structure; and
forming a contact plug in the first dielectric layer, the contact plug electrically connected to the source/drain regions;
forming a second dielectric layer by depositing a first etch stop layer on the first dielectric layer, a first nitride layer on the first etch stop layer, a second etch stop layer on the first nitride layer, and a second nitride layer on the second etch stop layer;
patterning the second dielectric layer to form a via hole having a bottom surface landing on the second dielectric layer;
deepening the via hole until the underlying contact plug is exposed;
filling the via hole with a conductive material; and
forming a metal layer on the second dielectric layer.

17. The method of claim 16, wherein the second etch stop layer is an oxide layer having a thickness larger than 20 Å.

18. The semiconductor device of claim 16, further comprising depositing the first etch stop layer in contact with a top surface of the contact plug.

19. The semiconductor device of claim 16, further comprising depositing the first etch stop layer in contact with the first dielectric layer.

20. The semiconductor device of claim 16, further comprising depositing an oxide layer on the second nitride layer.

* * * * *